United States Patent [19]

Miyata et al.

[11] Patent Number: 4,514,765
[45] Date of Patent: Apr. 30, 1985

[54] SOLID-STATE IMAGE SENSOR

[75] Inventors: Yutaka Miyata, Hirakata; Takao Chikamura, Kyoto; Shinji Fujiwara, Minoo, all of Japan

[73] Assignee: Matsushita Electric Industrial Co., Ltd., Osaka, Japan

[21] Appl. No.: 408,677

[22] Filed: Aug. 16, 1982

[30] Foreign Application Priority Data

Aug. 20, 1981 [JP] Japan .................... 56-129373

[51] Int. Cl.³ .............................................. H04N 3/14
[52] U.S. Cl. .................... 358/213; 358/212; 250/578
[58] Field of Search ............ 358/213, 212, 209; 250/578

[56] References Cited

U.S. PATENT DOCUMENTS 4,242,706 12/1980 McCormack et al. ............ 358/213

FOREIGN PATENT DOCUMENTS 126815 11/1978 Japan .................... 358/213
40366 4/1981 Japan .................... 358/213

Primary Examiner—Forester W. Isen
Assistant Examiner—Robert G. Lev
Attorney, Agent, or Firm—Stevens, Davis, Miller & Mosher

[57] ABSTRACT

A solid-state image sensor has a semiconductor substrate and a photoconductive film formed on the semiconductor substrate. The photoconductive film has a charge transfer function and subjects each field or group of picture elements to interlaced scanning. Flicker which otherwise results from inevitable differences between the magnitudes of setting voltages or areas of the photoconductive film portions with respect to the respective fields or groups of picture elements is significantly suppressed by changing the voltages applied to the photoconductive film portions with respect to each field or group of the interlaced picture element.

10 Claims, 10 Drawing Figures

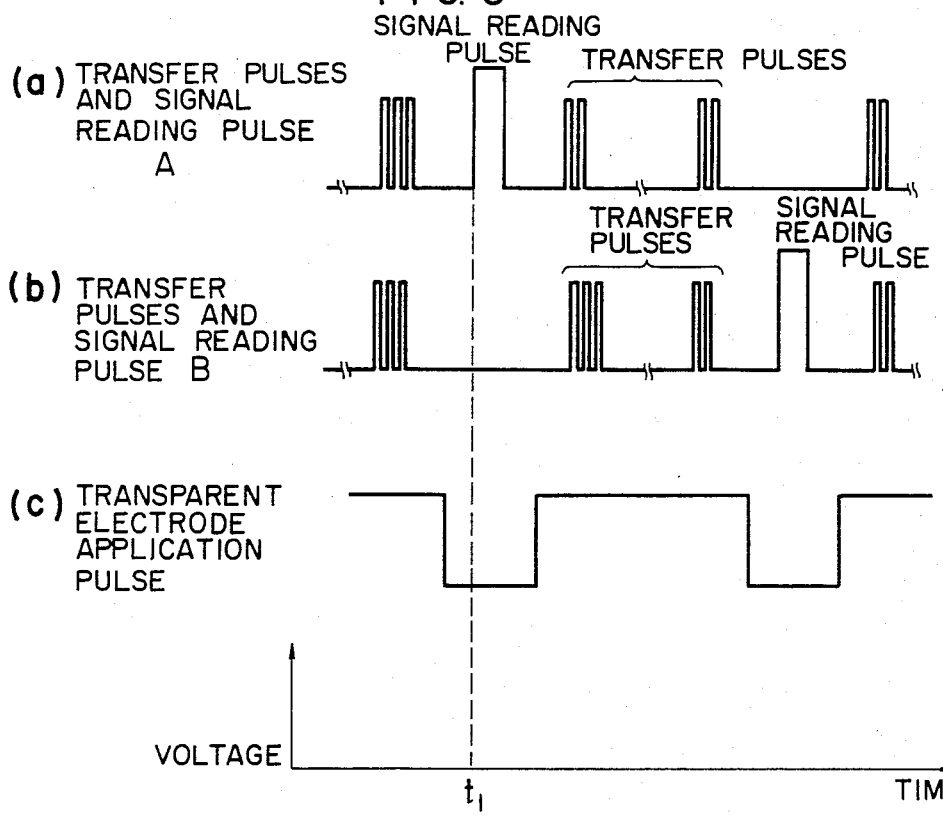
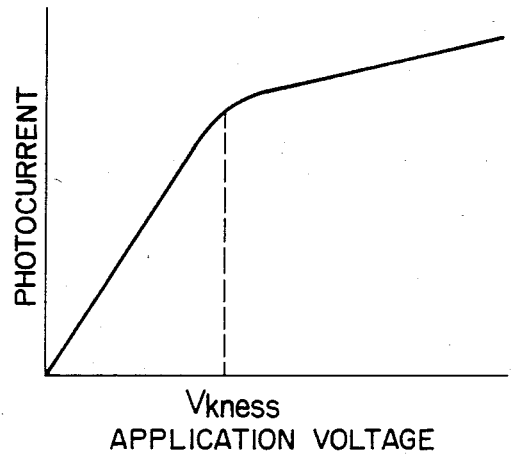

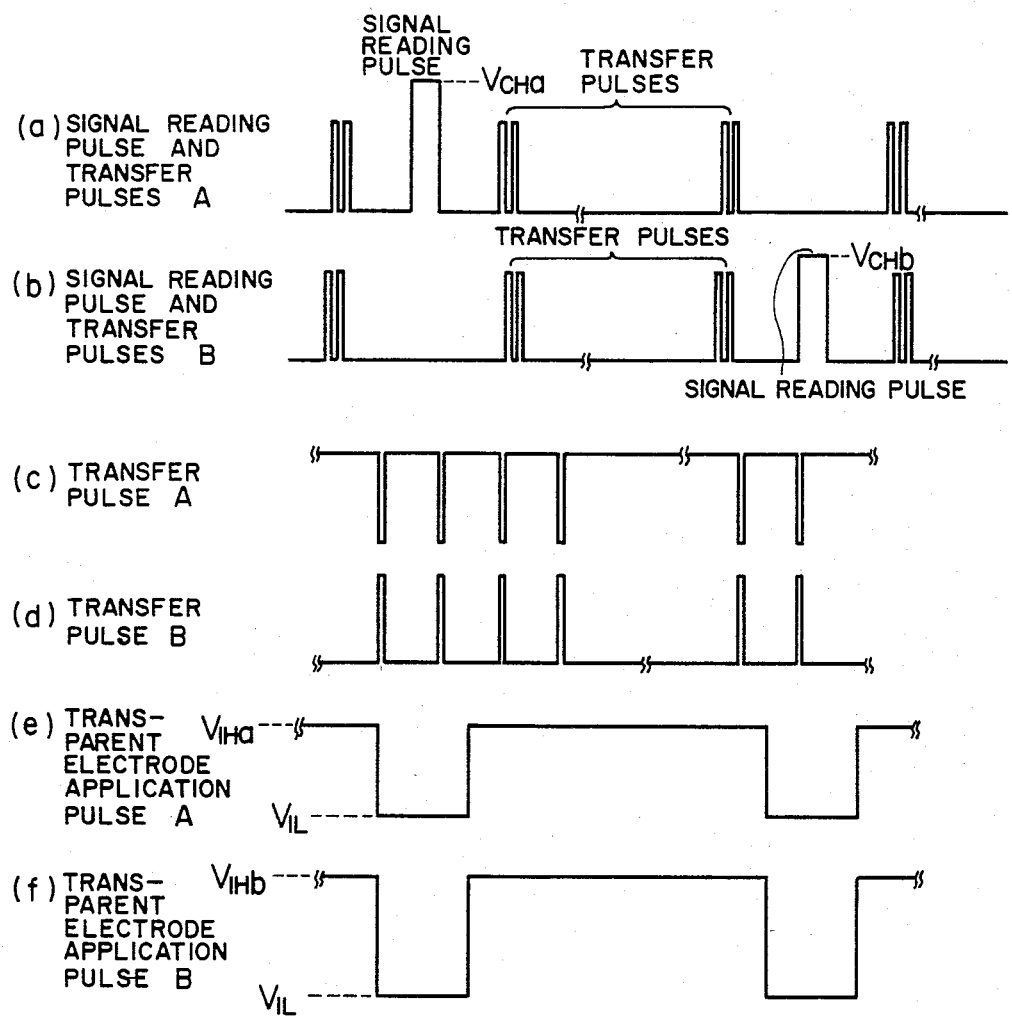

SOLID-STATE IMAGE SENSOR

FIELD OF THE INVENTION

The present invention relates to an improved solid state image sensor with a photoconductive film or layer in the photosensitive region and, more particularly, to a solid state image sensor which significantly suppresses the occurrence of flicker caused by the difference in a voltage applied to the photoconductive film and the difference in the area of the picture elements in interlaced scanning fields.

BACKGROUND OF THE INVENTION

Solid state image sensors are particularly useful for application to household VTR cameras and industrial TV cameras. Particularly, solid state image sensors with a photoconductive film type having the photosensitive section of photoconductive film and processing signals by signal scanning devices fabricated in a silicon substrate are attractive for use especially in small TV cameras on account of their high sensitivity and low smear characteristics.

The dominant Si scanning devices are of the MOS type wherein MOS switching devices are arrayed in matrix and signals are read out from the diode section formed of PN junctions by a shift register, or of the charge transfer type wherein signals are read out by MOS type FETs from the diode section formed on PN junctions to charge transfer devices such as CCDs or BBDs and then fed to the output section.

The present invention particularly concerns the solid state image sensor of the above-mentioned charge transfer type. The general operation of the solid state image sensor of the charge transfer type will first be described.

FIG. 1 is a plan view showing the formation of cells in the solid state image sensor with a photoconductive film type, and FIGS. 2A and 2B are cross-sectional views of a cell each taken along the lines A-B and D-C of FIG. 1, and FIG. 3 is a set of waveform diagrams showing drive pulses for the solid state image sensor shown in FIGS. 1, 2A and 2B. The solid state image sensor with a photoconductive film type shown in FIGS. 1, 2A and 2B has signal read-out MOS FETs formed as buried channels and a vertical transfer stage formed as buried channel CCDs. In the figures, diodes 12 (12a, 12b, 12c) and n-wells 13 (13a, 13b) for the buried channel CCDs are formed on a p-type semiconductor substrate 11. Reference number 14 (14a, 14b, 14c) denotes the channel sections of the buried channel MOS type FETs, and 15 (15a, 15b) is a gate oxide film. Reference number 16 (16a, 16b, 16c) is a set of gate electrodes formed of polycrystalline silicon. The gate electrodes 16 are insulated from an electrode 18 of a photoconductive film 19 by phosphosilicate glass (PSG) layers 17 (17a, 17b). Reference number 20 denotes a transparent electrode which conducts incident light rays 1. Reference number 21 denotes one means for changing a voltage applied to the photoconductive film 19. In the instant embodiment, reference number 21 refers to a power source capable of changing a voltage applied to transparent electrode 20. Although the elements 15 and 19 are referred to as films, no substantial difference will arise when they are formed as layers.

Next, an interlace scanning for the foregoing solid state image sensor will be described. For field A, when a signal read-out pulse is applied to the gate electrode 16 at a time $t_1$ as shown in (a) of FIG. 3, signal charges stored in the photoconductive film 19 and the diodes 12a and 12c are moved to the CCD transfer stage 13b, and the diodes 12a and 12c and the photoconductive film 19 are charged to a certain voltage level (this operation will be termed "reset" and the charging voltage will be termed the reset voltage). Pulses shown in (c) of FIG. 3 are applied to the transparent electrode 20 in order to prevent signal charges in the diodes from being moved to the transfer stage 13b by transfer pulses applied to the electrode 16, and serve to maintain the diode voltage higher by their capacitive coupling during periods other than the reset period. The charges moved to the transfer stage 13b are then transferred at a frequency of 15.75 kHz. In the arrangement of the solid state image sensor shown in FIGS. 1 and 2, the charge transfer stage 13b is provided with potential barrier regions 31a, 31b and 31c and storage regions 30a, 30b and 30c so that the charges are transferred in 2-phase drive mode. The diodes 12a and 12c and the photoconductive film 19 store light signals for one frame period (33.3 ms), then they are reset again. The term "one frame period" may be defined as two vertical scanning periods. The foregoing operation is the signal reading operation for field A. Similarly, field B is reset on expiration of one field period (16.67 ms) and signal charges are read out from the diode 12b and photoconductive film 19. The term "one field period" may be defined as one vertical scanning period.

In the foregoing solid state image sensor with a photoconductive film type employing charge transfer system for interlace scanning, it is unavoidable to have a difference in the reset voltage to the photoconductive film at fields A and B and also a difference in the area of picture elements. These differences lead to the causing of more or less flicker, and it has not been hitherto possible to eliminate such flicker completely. The reset voltage difference ($V_{nb} - V_{Na}$) in the foregoing conventional solid state image sensor can reach 0.5−1.5 V, that is high enough to cause flicker.

When the arrangement of FIG. 1 is operated by the drive pulses shown in FIG. 3, the reset voltage $V_N$ for the photoconductive film can be expressed as follows.

$$V_{Ni} = \gamma_i V_{CH} + V_{Pi} - \alpha V_{IH} - \beta V_{IL} + \phi \frac{C_p}{C_t} V_{Tr} - \frac{C_p}{C_t} V_{CH} \tag{1}$$

where, $\gamma_i$: Rate of change of the maximum channel voltage of the buried channel MOS type FETs to the gate voltage $V_{CH}$: Signal reading voltage $V_{pi}$: Pinch off voltage of the buried channel MOS type FETs $C_t$: Sum of the photoconductive film capacitance $C_N$, diode capacitance $C_S$ and parasitic capacitance $C_P$ $\alpha$: $(C_S + C_P)/C_t$ $\beta$: $C_N/C_t$ $V_{Tr}$: Transfer voltage for the vertical CCD transfer stage $\phi$: Transfer pulse duty cycle for the vertical CCD transfer stage $V_{IH}$: High voltage level of the pulse voltage to the transparent electrode $V_{IL}$: Low voltage level of the pulse voltage to the transparent electrode Suffix i used in the above equation signifies that the reset voltage $V_N$ varies in each field depending on the values of $\alpha$ and $V_p$. Also in equation (1), the 5th and 6th terms of the right side are due to the capacitive coupling between the transfer electrodes 16a and 16b and the electrode 18, and the 5th term represents the modulation component by the transfer pulse and the 6th term represents the effect of voltage drop caused when the signal reading pulse goes off.

The following will describe in connection with FIGS. 1 and 4 the cause of variation in the reset voltage $V_N$, i.e., variation in $\gamma$ and $V_p$ of picture elements in two fields, created during the fabricating process of the foregoing solid state image sensor. FIGS. 4(a) through (d) are cross-sectional views of the device essential portions in the fabricating process taken along the lines A-B-C-D of FIG. 1.

First, an n-type impurity, e.g., phosphorous, is doped in the substrate 11 for the n-well 13b of the transferring CCD and the channel sections 14a-14c and diode regions 12a and 12b of the MOS type FET ((a) of FIG. 4). Next, an impurity for compensating the n-type impurity, e.g., boron, is doped selectively with a mask of photoresist 40 in the potential barrier region 13b and channel section 14b of the MOS type FET, so as to form a potential barrier ((b) of FIG. 4). After the gate oxide film 15b and gate electrode 16b are formed, the MOS type FET, and CCD transfer stage of the picture element section for one field are completed ((c) of FIG. 4).

Next, boron is doped in the potential barrier region 31a and channel section 14a of the MOS type FET with one side self-aligned by the gate electrode 16b and another side mask-aligned by the photoresist 41 so as to form a potential barrier. Then a gate oxide film 15a and gate electrode 16a are formed, and the MOS type FETs and CCD transfer stage of the picture element section for another field are completed ((d) of FIG. 4).

As can be seen from the above-mentioned fabricating process, the channel sections 14a and 14b adjoining a MOS type FET correspond to fields A and B, respectively. Since these channel sections are formed by doping an impurity separately, their different doping conditions make it extremely difficult for both channel sections to have an equal pinch off voltage ($V_{pa} = V_{pb}$), and the channel sections 14a and 14b will have different pinch off voltages as shown in (e) of FIG. 4. The gate oxide films 15a and 15b are also formed separately and it is difficult for them to have the same thickness. Consequently, even if the same voltage is applied to the gate electrodes 16b and 16c of the MOS type FETs, the channel sections 14a and 14b will have different potentials, resulting in a difference in the reset voltage to the photoconductive film for fields A and B.

The photocurrent vs. applied voltage characteristic of a usual photoconductive film is shown in FIG. 5, and the quantum efficiency does not reach 1 even by application of a voltage higher than the knee voltage, but instead the photocurrent increases gradually as the applied voltage rises. Therefore, the photosensitivity varies depending on the magnitude of the applied voltage, and if the fields A and B have different reset potentials due to the foregoing reasons, the amount of signal charges created during the storing period varies even under the equal illuminance under which the photoconductive layer would have to create the same amount of signal charges, causing flicker to occur.

In summary, the causes of flicker in the solid state image sensor with a photoconductive film type are, first, the different impurity concentrations in the channel sections of picture elements for fields A and B, and second, the different thicknesses of the gate oxide films of picture elements for fields A and B.

Furthermore, another principal cause of flicker which can be considered is the difference in the area of picture elements for fields A and B. The cause of variation in the picutre element area will be described in connection with FIGS. 2 and 6. FIG. 6 shows the crossection of the sensor taken along the line E-F of FIG. 1. As shown in the figure, one gate electrode is formed such that its both end portions partly overlie another gate electrode for the purpose of improving the transfer efficiency of the CCD. Due to such arrangement, stepped portions are created differently for each field even by a method of melting the PSG 17 for decrease of their difference, causing the electrode 18 of the photoconductive film 19 formed on the PSG 17 to have a different shape for each field. As a result, photoconductive film 19 may have a different magnitude of area and electrostatic capacity for each picture element. In addition, as shown in FIG. 2A, the thickness of the PSG 17b along the line A-B is smaller than the thickness of the PSG 17a along the line D-C, resulting in a different parasitic capacitance between the gate electrode 16 and the electrode 18 of the photoconductive film in each field. In this case, equation (1) is rewritten as follows.

$$V_{Ni} = \gamma V_{CH} + V_{Pi} - \alpha V_{IH} - \beta V_{IL} + \phi \frac{C_{Pi}}{C_{ti}} V_{Tr} - \frac{C_{Pi}}{C_{ti}} V_{CH} \qquad (2)$$

Here again, suffix i used in the equation signifies that a setup voltage, which means the voltage of the photoconductive film during signal storing period, differs for each field as in the case of equation (1). Due to the difference in the magnitude of picture element area for each field, the amount of signal charges created in the photoconductive film in each field will differ even if the same reset voltage is applied to each field, and flicker cannot be prevented. In addition, the electrostatic capacity $C_N$ of the photoconductive film and parasitic capacitance $C_p$ may vary with each field, making the cause of creating flicker more complicated.

In view of the foregoing prior art deficiencies, it is an object of the present invention to provide a solid state image sensor which prevents flicker by varying the voltage applied to the photoconductive film in the first and second fields for the interlace scanning operation.

BRIEF SUMMARY OF THE FIGURES

FIGS. 3(a) through (e) are waveform diagrams of the pulses for driving the sensor shown in FIGS. 1, 2A and 2B.

FIG. 5 is a graphical representation showing the photocurrent vs. applied voltage characteristic of a usual photoconductive film.

FIGS. 7(a) through (f) are waveform diagrams showing the drive pulses embodied by the present invention.

DETAILED DESCRIPTION OF THE INVENTION

As mentioned previously, in the solid state image sensor with a photoconductive film type, picture elements belonging to field A and field B differ in the following respects.

(1) The impurity concentration ($N_A$ and $N_B$) at the channel sections of picture elements respectively belonging to field A and field B.

(2) The thickness ($T_A$ and $T_B$) of the gate oxide film of picture elements respectively belonging to field A and field B.

(3) The area magnitude ($S_A$ and $S_B$) of picture elements belonging to fields A and field B.

(4) The electrostatic capacity ($C_{NA}$ and $C_{NB}$) of the photoconductive films belonging to field A and field B.

(5) The parasitic capacitance ($C_{PA}$ and $C_{PB}$) of picture elements belonging to field A and field B.

The present invention contemplates to prevent the occurrence of flicker caused by the above structural differences of picture elements belonging to field A and field B, in such a way that the structural differences between the fields are compensated by varying the voltage applied to the photoconductive film in correspondence with field A and field B.

Figure 1:
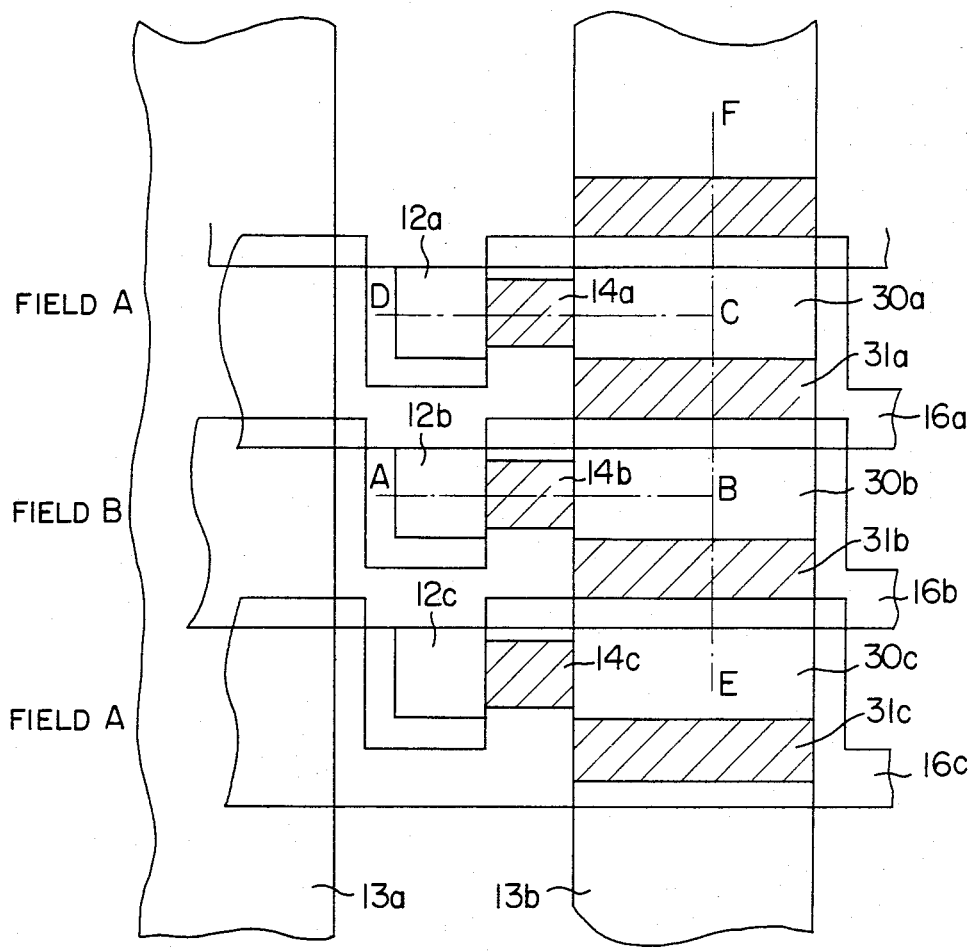
FIG. 1 is a plan view showing a plurality of units of the solid state image sensor with a photoconductive film type wherein the signal scanning device is formed as a CCD.
Figure 2A:
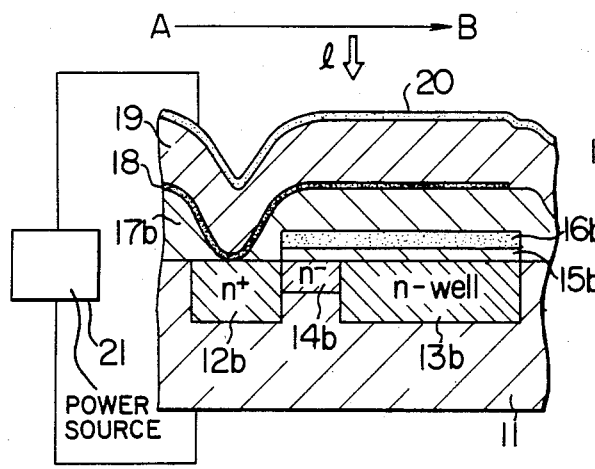
FIGS. 2A and 2B are cross-sectional views of picture elements for field A (the first field) and field B (the second field) of the sensor shown in FIG. 1.
Figure 2B:
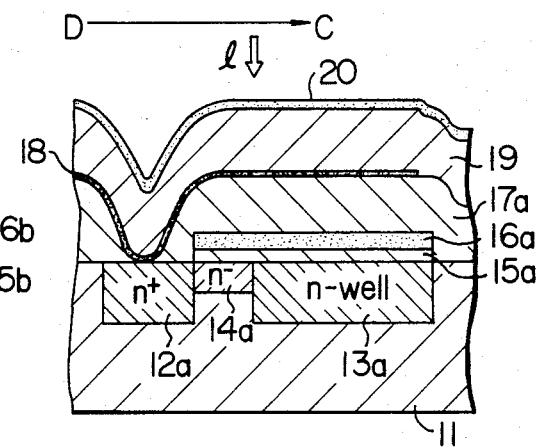
Figure 4:
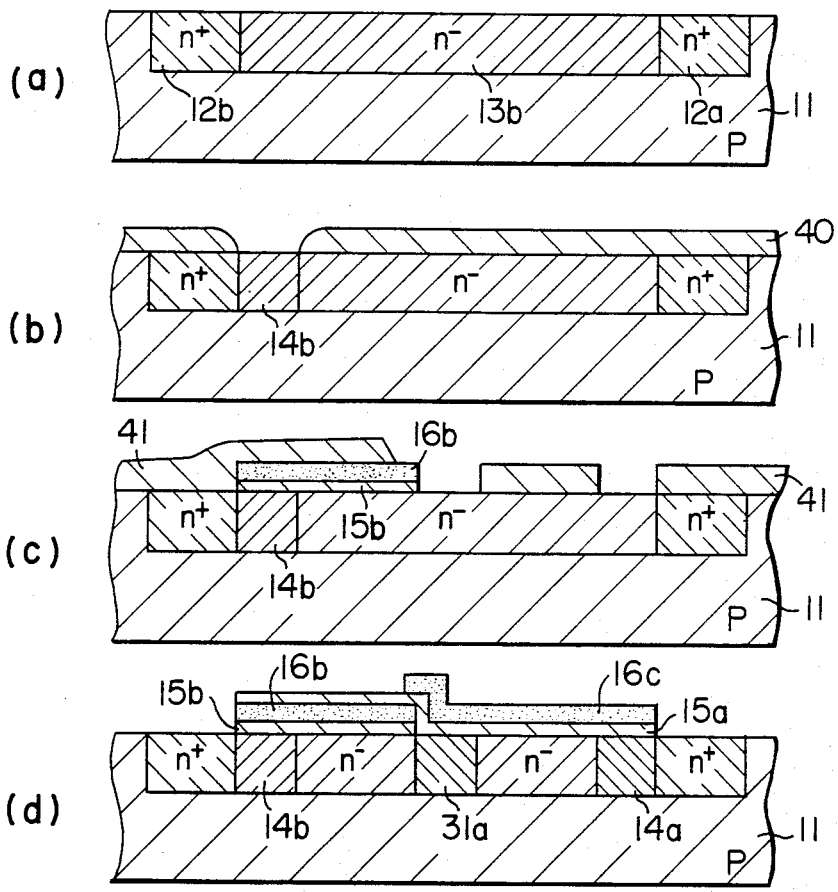
FIGS. 4(a) through (d) are cross-sectional views of the sensor during the fabricating process useful to explain the cause of flicker.
Figure 6:
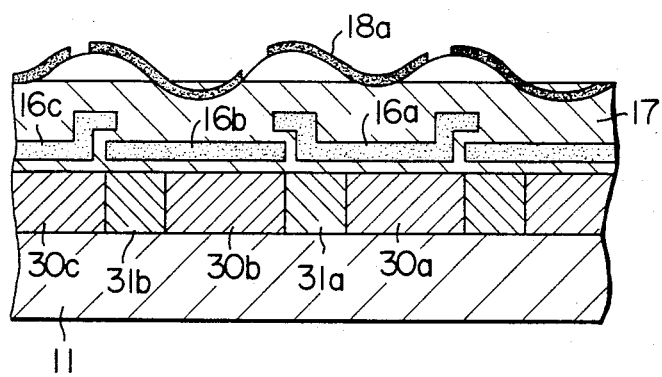
FIG. 6 is a simplified cross-sectional view of the sensor useful to explain another cause of flicker.

In the present invention, the variation in the setup voltage to the photoconductive film means the variation in the applied voltage between the transparent electrode 20 and the electrode 18 in two fields shown in FIG. 2 during the signal storing period. The voltage level of the electrode 18 is equal to the voltage level of the diodes 12a and 12b, and this voltage is determined from the amount of signal charges that are transferred from the diodes 12a and 12b to the charge transfer stages 13a and 13b by the signal reading pulses. Accordingly, the setup voltage can be controlled by varying the amplitude of the pulses applied to the electrode 20 or by varying the amplitude of the signal reading pulses to the gate electrodes 16a and 16b. The electrodes 16a and 16b are capacitively coupled to the electrode 18, and therefore the setup voltage of the photoconductive film 19 can also be varied effectively by changing the amplitude or duty cycle of the transfer pulses applied to the gate electrodes 16a and 16b.

Specifically, (1) a difference is caused between the magnitude of the pulse voltage for reading or moving signal charges collected by picture elements belonging to field A into the transfer stage and the magnitude of the reading gate voltage for reading signal charges collected by picture elements belonging to field B into the transfer stage, (2) a difference is caused between the magnitude of the voltage or duty cycle of the transfer pulses of the transfer stage for transferring signal charges collected by picture elements belonging to field A and the magnitude of the voltage or duty cycle of the transfer pulses related to field B, or (3) a difference is caused between the magnitudes of the pulse voltages applied to the transparent electrodes for determining the amount of signal charges to be collected by picture elements belonging to field A and field B respectively.

The following will describe embodiments for suppressing flicker by employment of the above three methods. For purposes of simplicity, the difference in the pinch off voltage at the channel sections 14a and 14b for fields A and B and the difference in the thickness of the gate oxide films 15a and 15b will solely be taken into account.

EMBODIMENT 1

The structural differences of picture elements belonging to field A and field B are compensated by varying the magnitude of the signal reading pulse voltage. First, the difference between the pinch off voltages at the channel sections 14a and 14b of picture elements belonging to field A and field B is defined as $\Delta V_p$, and the difference between the transformation coefficients from the voltages applied to the gate electrodes 15a and 15b to the voltages of the channels 14a and 14b, which is caused by the difference in the thickness of the gate oxide films 15a and 15b, is defined as $\Delta\gamma$. In order to compensate the differences in $V_p$ and $\gamma$ in two fields and to equalize the reset voltages applied to the photoconductive film 19, the following relationship expression needs to be met as can be seen from equation (1).

$$\left(\gamma - \frac{C_p}{C_t}\right)(V_{CH} + \Delta V_{CH}) + V_p = \left(\gamma + \Delta\gamma - \frac{C_p}{C_t}\right)V_{CH} + V_p + \Delta V_p \quad (3)$$

Accordingly, if the signal reading pulse voltages applied to picture elements belonging to field A and field B have a difference as expressed in the following equation which is derived from equation (3), the reset voltage applied to the photoconductive film 19 for field A and field B are made equal.

$$\Delta V_{CH} = (\Delta\gamma V_{CH} + \Delta V_p) / \left(\gamma - \frac{C_p}{C_t}\right) \quad (4)$$

Figure 8:
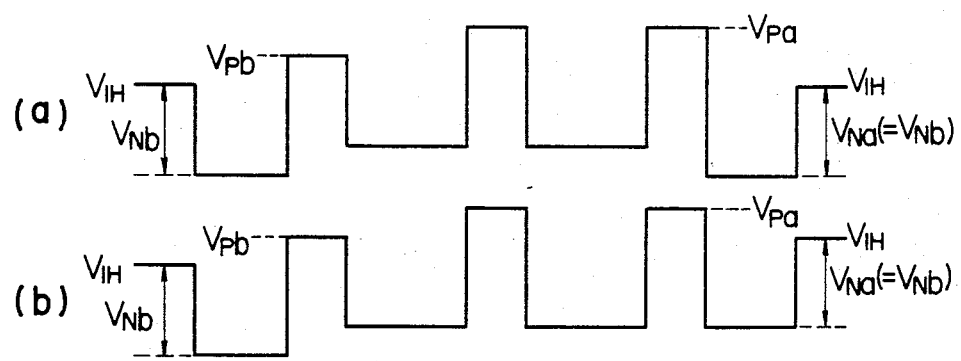
FIGS. 8(a) and (b) are illustrations showing potential wells of fields A and B created in accordance with the present invention.

FIG. 7 shows in (a) and (b) the drive pulse waveforms in the above operation, and the voltage difference $\Delta V_{CH}$ obtained by equation (4) is provided between the signal reading voltage $V_{CHa}$ applied to field A as shown in the pulses (a) of FIG. 7 and the signal reading voltage $V_{CHb}$ applied to field B as shown in the pulses (b) of FIG. 7. In consequence, the reset voltages $V_{Na}$ and $V_{Nb}$ of the respective photoconductive film for fields A and B are made equal as can be seen from the illustration of the potential wells in FIG. 8, and flicker can be suppressed significantly.

EMBODIMENT 2

The structural differences of picture elements belonging to two fields are compensated by varying the magnitude or duty cycle of the transfer pulses.

As in the case of embodiment 1, picture elements belonging to two fields are assumed to have different $\gamma$ and $V_p$. With the signal reading voltages being equal for picture elements of both field groups, if the transfer pulses applied to the transfer electrodes 16a and 16b each connected commonly to picture elements respectively belonging to field A and field B are controlled to have distinct duty cycles $\phi_A$ and $\phi_B$ or distinct voltages $V_{TA}$ and $V_{TB}$ so as to meet the following relational expression, the setup voltages applied to the respective photoconductive film 19 for field A and field B will be equal.

$$\left(\gamma - \frac{C_p}{C_t}\right) V_{CH} + V_p + \phi_A \frac{C_p}{C_t} V_{TrA} = \\ \left(\gamma + \Delta\gamma - \frac{C_p}{C_t}\right) V_{CH} + V_p + \Delta V_p + \phi_B \frac{C_p}{C_t} V_{TrB} \quad (5)$$

FIG. 7 shows in (c) and (d) the transfer pulse waveforms in this operation, where, as an example, the transfer pulse applied to the transfer electrode connected commonly to picture elements for field A, as shown in (c) of FIG. 7, is made to have a larger duty cycle than that for field B as shown in (d) of FIG. 7. In consequence, the setup voltages $V_{Na}$ and $V_{Nb}$ of the photoconductive film for fields A and B are made equal as can be seen from the illustration of the potential wells in FIG. 8, and flicker can be suppressed significantly.

EMBODIMENT 3:

The structural differences of picture elements belonging to two fields are compensated by varying the pulse voltage applied to the transparent electrodes.

As in the cases of embodiments 1 and 2, picture elements belonging to two fields are assumed to be different in $\gamma$ and $V_p$. It is also assumed that the magnitudes of the signal reading pulses and the voltage magnitudes and duty cycles of the transfer pulses are made equal for picture elements in each field.

Figure 9:
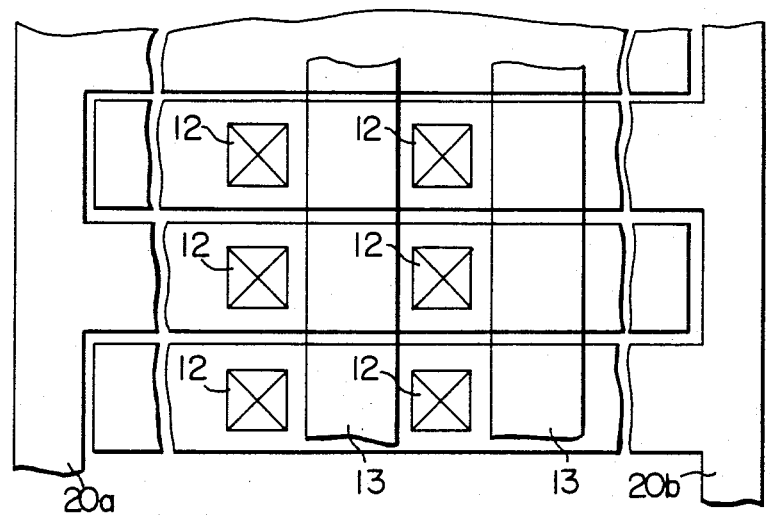
FIG. 9 is a simplified plan view showing another embodiment of the present invention.

As shown in FIG. 9, when the transparent electrodes 20 are formed separately for picture elements respectively belonging to two fields, the voltages applied to the respective transparent electrodes 20a and 20b can be set independently for each field. In order to compensate the differences in $\gamma$ and $V_p$ for two fields so as to equalize the setup voltages applied to the respective photoconductive film 19, the following relational expression needs to be met as can be seen from equation (1).

$$\left(\gamma - \frac{C_p}{C_t}\right) V_{CH} + V_p - \alpha V_{IHA} - \beta V_{ILA} = \\ \left(\gamma + \Delta\gamma - \frac{C_p}{C_t}\right) V_{CH} + V_p + \Delta V_p - \alpha V_{IHB} - \beta V_{ILB} \quad (6)$$

Accordingly, by provision of distinct magnitudes for $V_{IHA}$ and $V_{IHB}$ or $V_{ILA}$ and $V_{ILB}$ for the transparent electrodes of picture elements belonging to field A and field B, the setup voltages applied to the photoconductive electrode for field A and field B can be made equal. FIG. 7 shows in (e) and (f) the waveforms of pulses applied to the transparent electrodes 20a and 20b in this operation, where, as an example, the low level voltages applied to the transparent electrodes 20a and 20b are set equal, while the high level voltage $V_{IHA}$ of the pulse applied to the electrode 20a for field A as shown in (e) of FIG. 7 is made lower than the voltage $V_{IHB}$ for field B as shown in (f) of FIG. 7. In consequence, the setup voltages $V_{Na}$ and $V_{Nb}$ of the photoconductive film for field A and field B are made equal as can be seen from the illustration of the potential wells in FIG. 8, and flicker can be suppressed significantly.

Although the above three embodiments are for the compensation of the differences in $\gamma$ and $V_p$ of picture elements belonging to two fields, other differences between picture elements of the fields can also be compensated for in the same way. In case, however, where the magnitudes of picture element areas belonging to two fields are different, the amounts of signal charges produced in two fields will differ even if the reset or setup voltages of the respective photoconductive film 19 are made equal. In this case, the difference in the picture element area can be compensated by utilization of the photoelectric transformation characteristic of the photoconductive film shown in FIG. 5, by slightly varyiing the reset or setup voltages of picture elements belonging to the two fields.

Also in the foregoing three embodiments, one of the signal reading voltage, the magnitude or duty cycle of the transfer pulse, and the applied voltage to the transparent electrode is controlled. However, it will be appreciated that the same effect will also be achieved by controlling two or more parameters in combination.

Furthermore, the foregoing embodiments have been described taking an example that the signal reading MOS type FETs are formed as buried channels and the vertical transfer stage is formed as buried CCDs. However, the present invention is not limited to such an arrangement, but instead the signal reading MOS type FETs may be of the enhancement type, or any arrangement will be applicable provided that a charge transfer device is used for vertical transfer of charges. In the above embodiments, the same gate electrodes are used to control signal reading and charge transfer, however, they may be controlled by separate electrodes.

We claim:

1. A solid-state image sensor comprising a semiconductor substrate having a plurality of groups of picture-element diodes and a signal scanning means for interlaced scanning of said groups of diodes; a photoconductive film formed on said semiconductor substrate and electrically connected to said diodes; a transparent electrode formed on said photoconductive film; and voltage means for differentially applying a voltage to said photoconductive film corresponding to each group of said diodes in order to compensate for possible differences of setting voltages or areas of the photoconductive film for the respective groups of diodes.

2. A sensor according to claim 1, wherein said scanning circuit comprises CCDs or BBDs.

3. A sensor according to claim 1 or 2, wherein said scanning means includes vertical scanning signal-transfer electrodes each connected in common to a said group of diodes, and said voltage means comprises means for applying a different voltage magnitude to each said group of signal-transfer electrodes.

4. A sensor according to claim 1 or 2, wherein said scanning means incudes vertical scanning signal-transfer electrodes each connected in common to a said group of diodes, and said voltage means comprises means for applying a transfer pulse signal of a different duty ratio to each said signal-transfer electrode.

5. A sensor according to claim 1 or 2, wherein pulses for reading out signal charges from said diodes have an amplitude which is varied corresponding to the first and second fields.

6. A sensor according to claim 1 or 2, wherein said transparent electrode is applied with a voltage which is varied corresponding to the first and second fields.

7. A solid-state image sensor comprising a semiconductor substrate including a plurality of groups of diodes and signal scanning means for scanning said diodes group-by-group, said signal scanning means including vertical scanning signal-transfer electrodes each connected in common to a said group of diodes; a photoconductive film formed over and electrically connected to said diodes; a transparent electrode formed on said photoconductive film; and means for applying a different voltage magnitude to each said signal-transfer electrode in order to compensate for possible differences of setting voltages or areas of the photoconductive film for the respective groups of diodes.

8. A solid-state image sensor comprising a semiconductor substrate including a plurality of groups of diodes and signal scanning means for scanning said diodes group-by-group, said signal scanning means including vertical scanning signal-transfer electrodes each connected in common to a said group of diodes; a photoconductive film formed over and electrically connected to said diodes; a transparent electrode formed on said photoconductive film; and means for applying a transfer pulse voltage of a different duty cycle to each said signal-transfer electrode in order to compensate for possible differences of setting voltages or areas of the photoconductive film for the respective groups of diodes.

9. A solid-state image sensor comprising a semiconductor substrate having first and second fields of diodes and signal scanning means including signal read-out electrodes for interlaced-scanning of said diodes field-by-field; a photoconductive film formed over and electrically connected to said diodes; a transparent electrode formed on said photoconductive film; and means for applying a pulse of a different amplitude to each field of signal read-out electrodes in order to compensate for possible differences of setting voltages or areas of the photoconductive film for the respective groups of diodes.

10. A solid-state image sensor comprising a semiconductor substrate having first and second field of diodes and signal scanning means for interlaced scanning of said diodes field-by-field; a photoconductive film formed over and electrically connected to said diodes; transparent electrode portions formed on said photoconductive film corresponding to each said first and second fields of diodes; and means for applying voltages of different magnitudes to said transparent electrode portions in order to compensate for possible differences of setting voltages or areas of the photoconductive film for the respective groups of diodes.

* * * * *